(12) United States Patent  
Lubeley et al.

(10) Patent No.: US 11,486,941 B2  
(45) Date of Patent: Nov. 1, 2022

(54) MONITORING OF THE CONTACT REGION IN A PLUG DEVICE

(71) Applicant: AMAD Mennekes Holding GmbH & Co. KG, Kirchhundem (DE)

(72) Inventors: Markus Lubeley, Kirchhundem (DE); Stephan Didam, Schmallenberg (DE); Stefan Klos, Schmallenberg (DE)

(73) Assignee: AMAD MENNEKES HOLDING GMBH & CO. KG, Kirchhundem (DE)

( * ) Notice: Subject to any disclaimer, the term of this patent is extended or adjusted under 35 U.S.C. 154(b) by 48 days.

(21) Appl. No.: 17/259,452

(22) PCT Filed: Jul. 2, 2019

(86) PCT No.: PCT/EP2019/067760  
§ 371 (c)(1),  
(2) Date: Jan. 11, 2021

(87) PCT Pub. No.: WO2020/020586  
PCT Pub. Date: Jan. 30, 2020

(65) Prior Publication Data  
US 2021/0278481 A1    Sep. 9, 2021

(30) Foreign Application Priority Data  
Jul. 24, 2018    (DE) .................... 10 2018 117 815.8

(51) Int. Cl.  
*G01R 31/04*    (2006.01)  
*G01R 31/69*    (2020.01)  
(Continued)

(52) U.S. Cl.  
CPC ........... *G01R 31/69* (2020.01); *G01R 15/183* (2013.01); *G01R 27/205* (2013.01)

(58) Field of Classification Search  
CPC ........ G01R 31/54; G01R 31/55; G01R 31/56; G01R 31/66; G01R 31/67; G01R 31/68; G01R 31/69; G01R 15/183; G01R 27/205  
See application file for complete search history.

(56) References Cited

U.S. PATENT DOCUMENTS 6,529,011 B1    3/2003    Okubo  
9,130,286 B2*    9/2015    Schlogl ................ H01R 13/005  
(Continued)

FOREIGN PATENT DOCUMENTS

BE          427716       5/1938  
CN      202008524      10/2011  
(Continued)

OTHER PUBLICATIONS

International Search Report dated Oct. 24, 2019 by the European Patent Office in International Application PCT/EP2019/067760.

*Primary Examiner* — Thang X Le  
(74) *Attorney, Agent, or Firm* — Henry M. Feiereisen LLC

(57) ABSTRACT

In a method for the determination of an electrical contact property in a contact region between a first contact element of a first plug device and a second complementary contact element of a second plug device, a property of a current path including the first contact element, the contact region, and from the second plug device only the second contact element is evaluated and an induction voltage is generated in the current path for a measurement in the current path to thereby enable to draw a conclusion about the electrical contact property.

17 Claims, 8 Drawing Sheets

(51) Int. Cl.
*G01R 15/18* (2006.01)
*G01R 27/20* (2006.01)

(56) References Cited

U.S. PATENT DOCUMENTS

| | | |
|---|---|---|
| 2007/0273391 A1 | 11/2007 | Corry |
| 2009/0167286 A1* | 7/2009 | Naylor .................. G01R 31/58 |
| | | 324/66 |
| 2013/0314098 A1* | 11/2013 | Holma .................. G01R 31/66 |
| | | 324/508 |
| 2019/0128949 A1* | 5/2019 | Bowlerwell ........... H04R 29/00 |
| 2021/0096158 A1* | 4/2021 | Kraus .................. G01R 22/068 |

FOREIGN PATENT DOCUMENTS

| | | |
|---|---|---|
| CN | 206848406 | 1/2018 |
| DE | 30 30 805 | 3/1982 |
| DE | 40 33 052 | 4/1992 |
| DE | 102014006654 | 11/2015 |
| EP | 0 726 620 | 8/1996 |
| EP | 2 944 503 | 11/2015 |
| JP | 2007-285833 | 11/2007 |

* cited by examiner

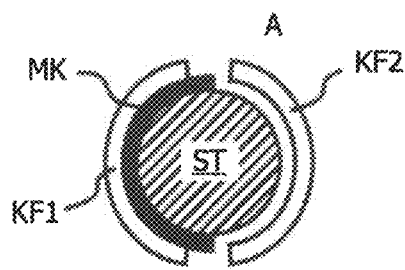 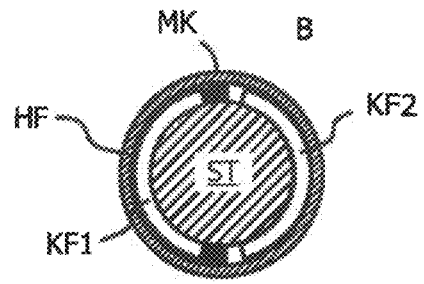
Fig. 17          Fig. 18
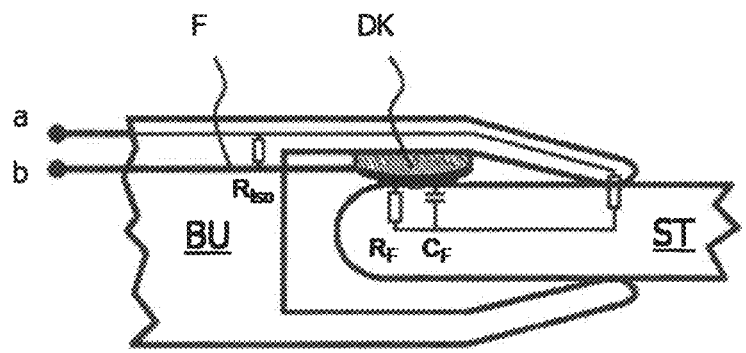
Fig. 19
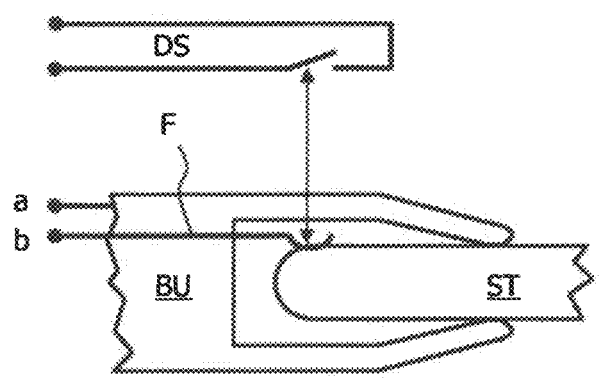
Fig. 20

MONITORING OF THE CONTACT REGION IN A PLUG DEVICE

CROSS-REFERENCES TO RELATED APPLICATIONS

This application is the U.S. National Stage of International Application No. PCT/EP2019/067760, filed Jul. 2, 2019, which designated the United States and has been published as International Publication No. WO 2020/020586 A1 and which claims the priority of German Patent Application, Serial No. 10 2018 117 816.8, filed Jul. 24, 2018, pursuant to 35 U.S.C. 119(a)-(d).

BACKGROUND OF THE INVENTION

The invention relates to a method for the determination of the electrical contact properties, such as in particular the contact resistance, in the contact region between two contact elements (plug pin, socket) of a plug device. Furthermore, it relates to a plug device configured to carry out this method.

Electrical plug devices such as for example plugs or sockets or couplings for power current according to DIN VISE 0623, EN 60309-2 ("CEE plug devices") or according to IEC 62196 ("E-car charging plug devices") include metallic contact elements (pins when a plug is involved and sockets when a power outlet is involved) via which the electrical contact realized in the plugged state. Due to contamination, oxidation, degradation of contact forces and the like, electrical resistances can be encountered in the contact region between these contact elements and cannot be neglected. Especially in the case of power plug devices, in which relatively high currents flow during operation, such contact resistances can result in unacceptable power loss. Since lost power is converted into heat, there is also the risk of dangerous overheating. Various measures have therefore been proposed in the art in order to monitor the temperature in a plug device. However, such systems can only react when heating and thus a potentially problematic situation has already occurred.

Against this background, it was the object of the present invention to provide alternative approaches for determining or monitoring the function of a plug device. These should preferably enable identification of problematic situations as early as possible.

SUMMARY OF THE INVENTION

This object is attained by a method as set forth hereinafter, and by a plug device as set forth hereinafter. Advantageous configurations are set forth in the subclaims.

A method according to the present invention is intended to determine the electrical contact properties in the contact region between a contact element of a first plug device (hereinafter also referred to as "first contact element") and a complementary contact element (also referred to as "second contact element") of a complementary second plug device. The first plug device can have a coupling with sockets as first contact elements and the second plug device can have a plug with plug pins as second contact elements, or vice versa, with the plug devices usually also containing further components (housing, inserts, etc.) in addition to the contact elements. The method is characterized in that the properties of at least one current path are evaluated, which includes
  the first contact element,
  the contact region, and
  from the second plug device only the second, complementary contact element and, optionally, further contact elements of the second plug device.

By definition, the current path forms an electrically conductive connection between two connections via which a direct current or at least an alternating current can flow or does flow. When these connections are identical, there is then the presence of an electric circuit. Otherwise, a dosed electrical circuit is typically established by connecting the connections to an evaluation circuitry.

The ends or connections of the current path are typically in or are part of components of the first plug device, so that the current path is completely accessible from the first plug device.

The electrical conductivity of the current path can be conductive, i.e. to permit the flow of a direct current (the level of the ohmic resistance is typically less than approx. 100 k$\Omega$). In addition or as an alternative, the current path can have a capacitive conductivity, for example when including a capacitance connected in series (the size of such a capacitance is typically more than approx. 10 pF, preferably more than approx. 100 pF, more than 1 nF, or more than 3 nF).

The electrical contact properties can be determined both qualitatively and quantitatively. A qualitative determination could, for example, involve the determination that the contact properties are suitable or are unsuitable for a safe operation. A quantitative determination can in particular relate to the determination of the value of the contact resistance between the first and second contact elements.

The method has the advantage that the electrical contact properties can be determined solely from the side of the first plug device by using the described current path. To complete the current path, from the second plug device only the complementary second contact element (and optionally or in exceptional cases one or more other contact elements of the second plug device) is used, which, however, is anyway joined together with the first contact element during the plugging process. As a result, no structural alterations to the second plug device are necessary, so that the method is independent of the type, age, manufacturer and the like of the second plug device being used.

The specific composition of the used current path and the applied measuring principle can be designed in different ways. According to a first embodiment, the used current path includes at least one sensor which is arranged in the first plug device and which contacts the complementary second contact element in a further (different) contact region, when the two plug devices are plugged together. Such a sensor is usually not present in a conventional plug device, but is provided exclusively or i.a. for the present method. As a result of the sensor, two contact regions are provided in the plugged state between the first plug device and the complementary second contact element. A current path realized essentially in the first plug device can thus include from the second contact element only the piece which is located between the two contact regions (and nothing else of the second plug device). The contact resistance in the contact region of interest between the contact elements of the plug devices lies in this current path and is therefore accessible for measurement.

In a first further refinement of the afore-described embodiment with a sensor, the voltage drop that occurs when an operating current flows across the contact region of interest is measured across the formed current path. The "operating current" flows hereby by definition during the originally intended operation of the plug device via the considered (and typically via at least two further) contact elements, so as to drive for example a consumer, such as an electric motor, or to charge an accumulator. In the case of power plug devices, this operating current is in the range of one to three-digit ampere values, so that a relatively small contact resistance leads to a significant, verifiable voltage drop. This voltage drop also occurs in the formed evaluation current path and forms an indicator for the contact properties in the contact region of interest. If the magnitude of the operating current, which the measurement is based on, is also known, the prevailing contact resistance in the contact region can also be calculated in addition to the determined voltage drop.

When using a sensor, it should be noted that in the contact region between this sensor and the second contact element of the second plug device, there are also normally unknown contact properties that may make it difficult to determine the contact properties in the contact region of interest. Therefore, optionally before an evaluation or a measurement leading to the evaluation, defined contact properties can be established between the sensor and the second contact element of the second plug device. There are various possibilities for this purpose. For example, a reproducible contact pressure that is as well defined as possible could be provided using constructive measures. The higher the contact pressure, the higher the likelihood that oxides, foreign layers, etc. will be breached. However, there are limits to the increase in contact pressure: the sensor should cause only a slight increase of the actuating forces of the plug. In addition or as an alternative, a procedure working with electrical methods may find application, by which a possibly existing insulating layer (made of oxides, foreign layers or like) is penetrated, when a suitable voltage (hereinafter referred to as "breakdown voltage") is applied. After this process, also known as "frifting", the voltage in the transition region between the contact elements is usually at most in the order of magnitude of the melting voltage of the material of the contact surface. This ensures a defined value or at least a defined maximum value.

According to a further embodiment, the first plug device includes two (or more) sensors, each with its own and separate contact region to the second contact element. Therefore, three or more current paths can be evaluated, which include different combinations of the at least three contact regions formed between (a) the second contact element and (b) the first contact element and/or the various sensors. Thus, several independent measurements are possible, from which the unknown variables, such as the contact resistances, can be determined.

In another embodiment of the invention, an induction voltage is generated in the used current path. This has the advantage that measurements can be made in said current path without mechanical/electrical contacting, so as to be able to draw conclusions about the contact properties of interest.

In a particular configuration of the above embodiment, the current path under consideration forms the secondary coil (normally with a single coil turn) on a magnetic core, which is arranged in the first plug device and on which a primary coil is also arranged. The system can then be excited in a controlled manner via the primary coil, thereby leading to the generation of the induction voltage in the secondary coil via the magnetic core, i.e. in the current path under consideration. The electric properties of the current path depend hereby on the contact properties of interest in the contact region and can be detected, for example, as a reaction in the primary coil. For example, the input impedance of the system can be determined at the primary coil and depends in a defined way on the contact resistance in the contact region of interest.

In addition or as an alternative, the electrical properties of the current path may also be determined in the above case with the aid of a separate measuring coil laid around the current path.

The sockets of plug devices are often designed in such a way that they contain two or more contact fingers which are arranged in parallel relation around a cylindrical cavity and project in parallel relation from a common base of the socket. Each of these contact fingers has its own contact region to an inserted plug pin and can therefore be viewed within the scope of the method described here as an independent "first contact element". For the operation of the plug device, however, only the contact resistance formed jointly by all contact fingers (in parallel connection) with the associated plug pin is generally of interest, so that the contact fingers of one and the same socket can also be treated as a single "first contact element" within the scope of the method described here. The contact resistance to this "first contact element" is then formed by connecting the contact resistances in parallel to the individual contact fingers.

Sockets with several contact fingers can be connected to one another at their free ("distal") ends in an electrically conductive manner, for example via an externally circumferential spring ring which presses the contact fingers inwards. When, on the other hand, two or more contact fingers of a socket are electrically separated from one another outside the common base, the current path under consideration can be formed such that they are arranged in series therein. Part of the contact fingers then form a first portion of the current path, another part of the contact fingers a second portion, with these two portions being electrically connected by an inserted plug pin on the one hand, and by the common base of the contact fingers on the other hand. In such a configuration, part of the contact fingers can be arranged, for example, on one side and another part of the contact fingers on the other side of an annular magnetic core, so that overall a winding of a secondary coil is formed as described above.

The above considerations also apply analogously to the case of a plug pin which is split in the longitudinal direction, with the parts of this pin assuming the role of the contact fingers.

In the case of more general structural designs of the contact elements, a magnetic core can also be arranged in surrounding relation to the contact region between the first and second contact elements. In this case, for example, the induction of a voltage in the current path under consideration is possible regardless of whether the contact fingers are exposed.

Depending on the configuration, the described method interacts differently with the typical operation of the plug device. In the above-discussed determination of a voltage drop in the contact region of interest, the operation of the plug device is necessary, for example, to carry out the method. Conversely, in the case of an evaluation with the generation of an induction voltage, the high currents flowing during operation can have a disruptive effect. It can therefore generally be preferred to synchronize the evaluation according to the method of the invention with the course of an operating current. In terms of an ON/OFF synchronization, this can mean, for example, that the evaluation only takes place in the absence of a flow of operating current, or, conversely, it only occurs in the presence of a flow of operating current. Furthermore, the synchronization can also be related to a modulation of the operating current, for example when measurements are preferably carried out in the range of the zero crossings of an operating alternating current.

According to a second aspect, the invention relates to a plug device (hereinafter also referred to as "first plug device") with at least one first contact element, which contacts a second (complementary) contact element of a second, complementary plug device in the plugged state of the plug devices in a contact region, with the plug device being configured to evaluate the properties of at least one current path, which includes the first contact element, the contact region, and from the second plug device only the second contact element and, optionally, further contact elements of the second plug device.

The device is thus configured to carry out a method according to one of the afore-described embodiments. The explanations and modifications relating to the process therefore also apply accordingly to the plug device, and vice versa.

According to a further refinement, the plug device preferably includes at least one sensor, which is arranged in the first plug device and contacts in the plugged state with the second plug device the complementary second contact element in a further contact region. The sensor is typically electrically insulated from the first contact element, so as to offer a separate electrical access to the second contact element.

In another embodiment, the plug device includes a magnetic core which surrounds the first contact element and/or a sensor of the afore-described type and/or the contact region. With such a magnetic core, a voltage can be induced in the first contact element or the sensor and thus in the involved current path. Preferably for this purpose, a primary coil is further located on the magnetic core. Furthermore, the core may, optionally, be closed all around or have a local or distributed interruption ("air gap").

The plug device can furthermore include an evaluation circuitry for evaluating the properties of the mentioned current path in a method according to one of the afore-described embodiments.

BRIEF DESCRIPTION OF THE DRAWING

In the following, exemplified embodiments of the invention will be explained in greater detail with reference to the figures. It is shown in:

FIG. 17 a section along the line A of FIG. 16;

FIG. 18 a section along the line B of FIG. 16;

FIG. 19 schematically a current path which includes a plug pin, a socket and a socket-side pressed-on sensor for a measurement with conductive and/or capacitive conductivity of the current path;

FIG. 20 schematically a current path which includes a plug pin, a socket and a socket-side sensor as well as a detection circuitry coupled mechanically to the sensor for the plugged state;

DETAILED DESCRIPTION OF PREFERRED EMBODIMENTS

Figure 1:
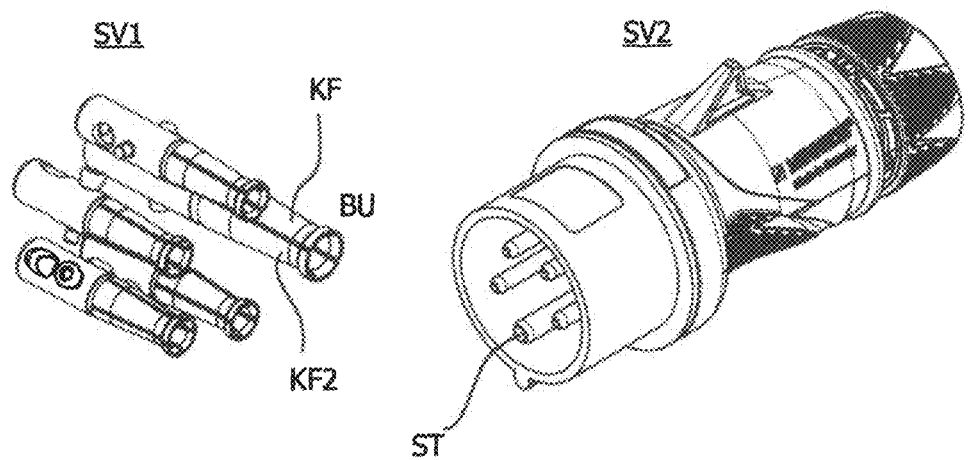
FIG. 1 the sockets of a first plug device (coupling) and a plug as second plug device with plug pins that are complementary to the sockets.

For the sake of clarity, FIG. 1 shows by way of a perspective view from a coupling only the sockets BU as the first plug device SV1. In the example shown, each of the five sockets BU includes a cylindrical base, from which four projecting contact fingers KF extend in parallel relation and enclose a cylindrical cavity. Furthermore, the Figure shows a plug as a second plug device SV2 with plug pins ST that complement the sockets. As the plug SV2 is plugged together with the coupling SV1. the plug pins ST come into electrically conductive contact in contact regions with the sockets BU.

Due to aging processes, corrosion, contamination, and the like, a relatively high contact resistance can occur in the contact regions, causing an unacceptably high amount of heat loss. Therefore, it is desirable to determine or monitor the electrical contact properties in the contact regions, especially the contact resistance in the contact region between a plug pin ST and the associated socket BU.

The components necessary for such a determination should hereby be accommodated if possible only in one of the two plug devices SV1, SV2, so that monitoring is independent of the type and origin of the used complementary plug device. In most of the exemplary embodiments described hereinafter, the required components are accommodated in the coupling as the first plug device SV1, while any plug may in principle be used as second plug device SV2. However, the corresponding explanations also apply (with the corresponding adjustments) to reversed roles of coupling and plug.

Figure 2:
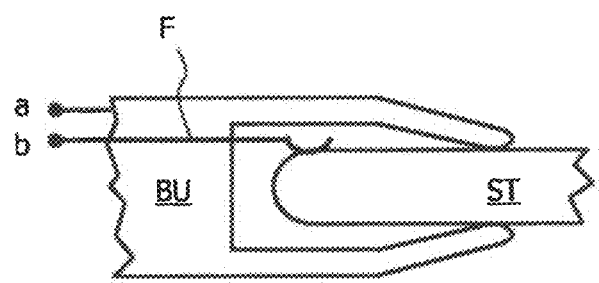
FIG. 2 schematically a current path which includes a socket, a plug pin, and a socket-side sensor which contacts the plug pin within the socket.

FIG. 2 shows a schematic partial cross section through a first contact element in the form of a socket BU, into which a plug pin ST is inserted as a complementary second contact element. The socket BU can be a sleeve that is closed all-round or made of several contact fingers that protrude in parallel relation from a base. The contact fingers can be separated at their free, distal end (cf. FIG. 1) or be electrically connected to each other. Between the plug pin ST and the socket BU or its contact fingers, there is (at least) one contact region via which the electrical operating current flows during operation. The contact properties of this contact region, in particular the contact resistance thereof, shall be determined according to the invention with components arranged in the coupling.

The afore-described structure corresponds to the situation with conventional plug devices and forms the starting point also in the following FIGS. 3, 4, 5 as well as 19 and 20.

In the embodiment according to FIG. 2, provision is made from this starting base for arrangement of an electrically conductive sensor F at the bottom of the socket BU, with the tip of the sensor contacting the plug pin ST when the latter is fully inserted into the socket. Contact is hereby established with slight normal contact force, whereas insertion and pulling forces remain almost unaffected. The sensor F can be implemented, for example, with spring wire made of nickel silver or bronze (both materials have very good spring properties, good to very good corrosion resistance, and do not necessarily need a coating). Furthermore, the sensor is electrically insulated from the socket BU and guided to the outside at a connection b.

A second connection a is formed to the material of the socket BU. A current path is thus formed between the connections a, b, and includes the following components:
the socket BU;
the plug pin ST, which contacts the socket in the contact region of interest;
the sensor F, which contacts the plug pin ST in a separate second contact region.

A suitably designed evaluation circuitry (not shown) can be connected to the connections a, b in order to determine the properties of the current path and, in particular, those of the contact region of interest.

Figure 3:
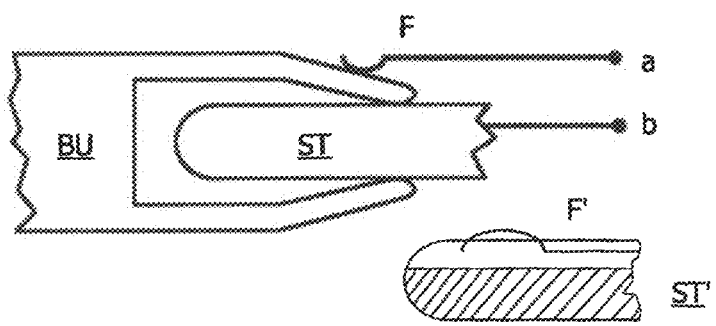
FIG. 3 schematically two embodiments of a current path which includes a plug pin, a socket and a plug-side sensor.

FIG. 3 shows an embodiment in which the measurement of the contact properties is realized on the plug side. For this purpose provision is made for two connections a, b, of which one (b) is connected to the plug pin ST and separately therefrom the other (a) is connected with a sensor F which contacts in the plugged state the socket BU from the outside.

The inset in the Figure (bottom right) shows an alternative embodiment in which the plug pin ST' has a recess or groove extending in axial direction. A sensor F', which can contact the socket BU from the inside, is arranged in this groove, insulated from the plug pin ST'.

Figure 4:
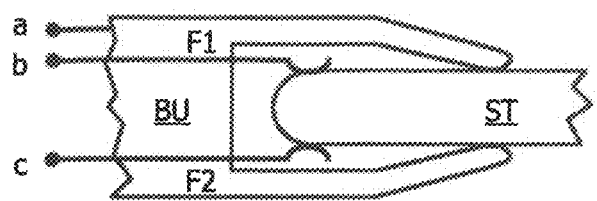
FIG. 4 schematically a current path which includes a socket, a plug pin and two socket-side sensors.

FIG. 4 shows an embodiment similar to that of FIG. 2, but provision is made here in addition to the first sensor F1 for a second sensor F2 which contacts the plug pin ST in a separate third contact region and which is guided to a connection c that is electrically separated from the socket and the first sensor F1. In this case, a suitable evaluation circuitry can make use of all three connections a, b and c.

Figure 5:
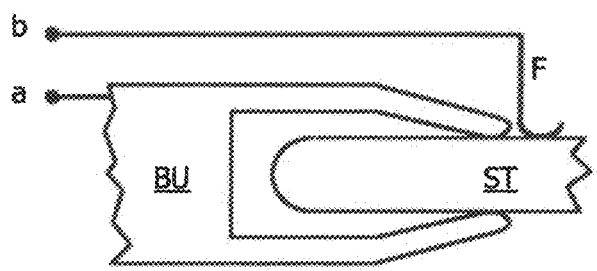
FIG. 5 schematically a current path which includes a socket, a plug pin, and a socket-side sensor which contacts the plug pin outside the socket.

FIG. 5 shows an alternative construction to FIG. 2, in which the sensor F is not located on the bottom of the socket BU, but rather contacts the plug pin ST outside of the socket.

Figure 6:
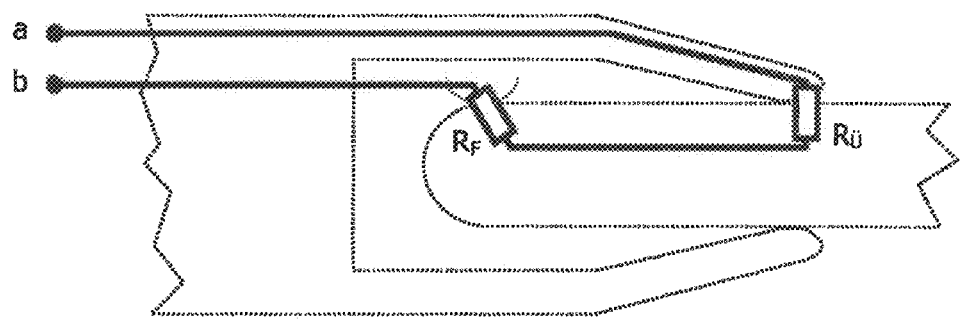
FIG. 6 the current path of FIG. 2 with a superimposed equivalent circuit diagram.

FIG. 6 shows an equivalent circuit diagram of the formed electrical current path for the arrangement of FIG. 2. The current path between the connections a and b extends via the base and the contact fingers of the socket, from there via the contact resistance $R_0$ of interest in the plug pin, from there via the further contact resistance $R_F$ in the second contact region between plug pin and sensor to the sensor, and finally ends in connection b. Within the solid material of the socket or plug pin, the resistance can normally be neglected compared to the contact resistances $R_0$, $R_F$ in the contact regions.

Figure 7:
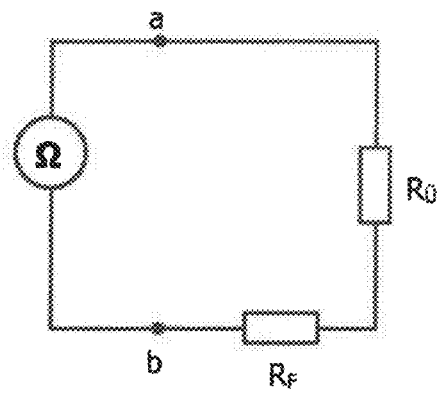
FIG. 7 the equivalent circuit diagram for a direct resistance measurement.

FIG. 7 shows once again the equivalent circuit diagram of FIG. 6, with a measuring device being additionally connected between the connections a and b. As indicated in the Figure, this could involve an ohmmeter to measure the resistance in the current path, which is essentially additively comprised of the two serially connected contact resistances $R_0$ and $R_F$. However, since both resistances are unknown beforehand, such a measurement of the sum $(R_0+R_F)$ would not allow conclusions about the contact resistance $R_0$ of interest.

The arrangement of FIG. 4, in which two sensors, F1 and F2, and thus three (unknown) contact resistances $R_0$, $R_{F1}$ and $R_{F2}$ are present, offers a way out of this situation. The three independent measurements of the total resistance $R1=(R_0+R_{F1})$ between a and b, the total resistance $R2=(R_0+R_{F2})$ between a and c, as well as the total resistance $R3=(R_{F1}+R_{F2})$ between b and c can then be used, however, to determine the contact resistance $R_0$ of interest as $R_0=(R1+R2-R3)/2$. Prerequisite for this is that the three contact resistances R1, R2, R3 can be measured with sufficient accuracy.

Figure 8:
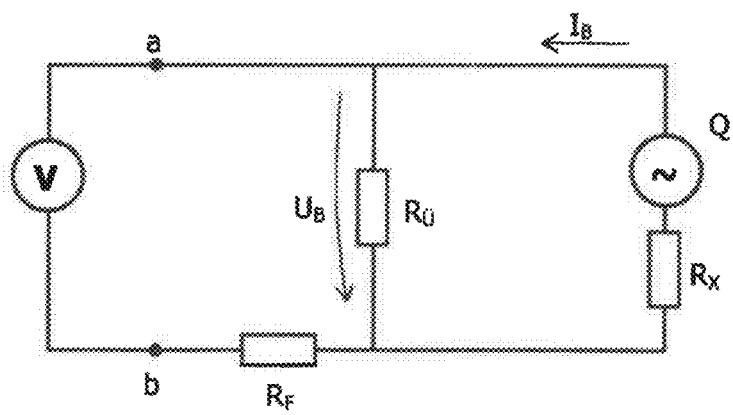
FIG. 8 the equivalent circuit diagram of FIG. 7 supplemented by an electric circuit for the operation, configured for measuring the voltage drop in contact region under operating conditions.

FIG. 8 illustrates a further measuring principle which can be achieved with a single sensor (see FIGS. 2, 3, 5) and which is carried out in the operating state of the plug device. In this regard, the operating circuit is indicated in the right part of the Figure and includes an AC voltage source Q, the contact resistance $R_0$ of interest, and a consumer $R_x$. The operating current $I_B$ flowing in this electrical circuit generates at the contact resistance $R_0$ a voltage drop $U_B$. The latter can be measured with a voltmeter at the connections a, b.

The unknown contact resistance $R_F$ between the sensor and the plug pin does not interfere with such a voltage measurement when the contact resistance is sufficiently small compared to the internal resistance of the voltmeter. Because the voltage drop $U_B$ generated in the operating circuit at the contact resistance $R_0$ generates across the connection a, the voltmeter, the connection b, and the contact resistance $R_F$ a measuring current which is small due to the high internal resistance in the voltmeter. In addition, a high internal resistance compared to the contact resistance $R_F$ ensures that essentially the entire voltage drops at the voltmeter.

Figure 9:
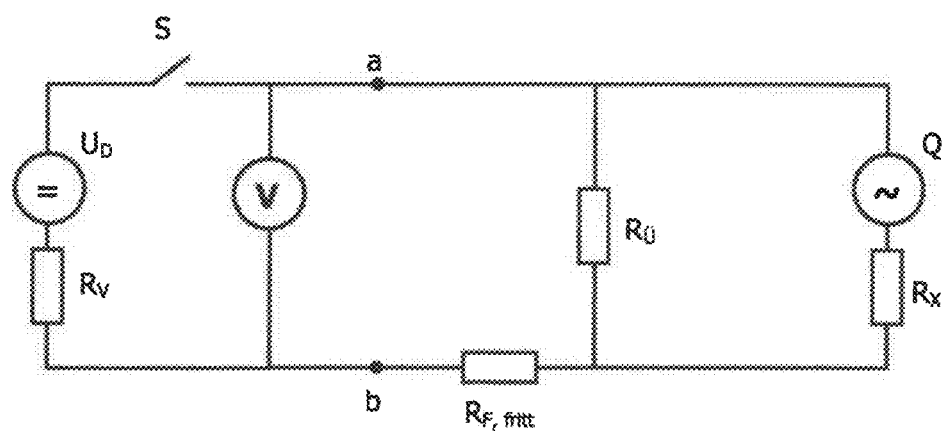
FIG. 9 the equivalent circuit diagram of FIG. 8 supplemented by a voltage source for generating a breakdown (fritting) in the contact region of a sensor.

FIG. 9 shows an extension of the circuitry of FIG. 8, with which the mentioned condition can be achieved that the contact resistance $R_F$ at the sensor should be small compared to the internal resistance of the voltmeter. For this purpose, a breakdown voltage $U_D$ of sufficient magnitude is applied to connections a and b via a switch S. In detail, the following exemplary sequence can be established:

Initially, for a period of approx. 1 second, the switch S is closed ("phase 1"). A voltage $U_D$ of approx. 50 V has the effect that insulating oxides, foreign layers, etc. present on aged contacts are penetrated or fritted, so that afterwards via the contact and via a series resistor $R_v$ of approx. 500Ω a current of approx. 100 mA (=50 V/500Ω) flows. After breakdown/fritting, the voltage at the transition between sensor and plug pin is at a maximum in the order of magnitude of the melt voltage of the material of the contact surface. For nickel, for example, the melting temperature is 1453° C. and the associated melting voltage is 0.65 V. The contact resistance $R_{F,frit}$ sensor to plug pin, created by the fritting, is in the order of magnitude of 1 V/100 mA=10Ω.

For checking purposes, a voltage measurement can be carried out when the switch S is closed. Otherwise, the purpose of phase 1 is only to establish between the sensor and the plug pin a contact resistance $R_{F,frit}$, which is at least one order of magnitude lower than the high internal resistance with which the voltage measurement is carried out.

At the beginning of the subsequent "phase 2", the switch S is opened. A voltage measurement now yields the sought voltage drop $U_B$ between plug pin and socket during operation of the plug device.

When the operating current $I_B$ is known from another point, an evaluation circuitry is able to calculate the contact resistance $R_0$ from voltage drop $U_B$ and current $I_B$. But even without knowledge of the operating current, the voltage drop represents a valuable information: In the case of a plug device, a voltage drop plug pin to socket of for example up to 25 mV is still regarded as a stable operation, but permanent operation can be called into question from approx. 50 mV onwards (this corresponds with a 125 A-plug device to a contact resistance plug pin to socket of 0.4 mΩ; other limit values for the voltage are possible).

Since the crucial feature involves the measurement of the voltage drop in phase 2, phase 1 may be dispensed with entirely, when the sensor is appropriately designed.

Phase 2 can be followed immediately by phase 1. However, a rest phase ("phase 3") can also be taken between the two phases.

An alternative course of a measurement in an arrangement with two sensors can look as follows (with reference to FIG. 4):

Phase 1: Momentary current across a and b to "prepare" the transition between first sensor F1 and plug pin ST.

Phase 2: A current is briefly impressed across connections a (socket BU) and c (second sensor F2) and is in the order of magnitude of the later operating current (across socket BU and plug pin ST). The voltage drop between a and b (first sensor F1) is measured.

Phase 3: If phase 2 has resulted in an "OK", e.g. the operating voltage/the operating current is connected via a contactor. Otherwise a warning message is triggered.

The method can thus be used to check the properties of the transition plug pin to sleeve before connecting the operating current.

An advantage of the described methods is their functional independence on the mode of contact plug pin to socket ("X-contact" according to WO 2016/184673 A1, torsion spring, etc.). Furthermore, they can be carried out during ongoing operation and the operating current does not falsify any measured values.

FIGS. 10-18 illustrate a further method which uses a voltage induced in a current path. Such a method can be carried out in particular with the sockets BU shown in FIG. 1, which have two (or more) contact fingers KF in parallel relation to one another on a common base without making contact at the distal end.

Figure 10:
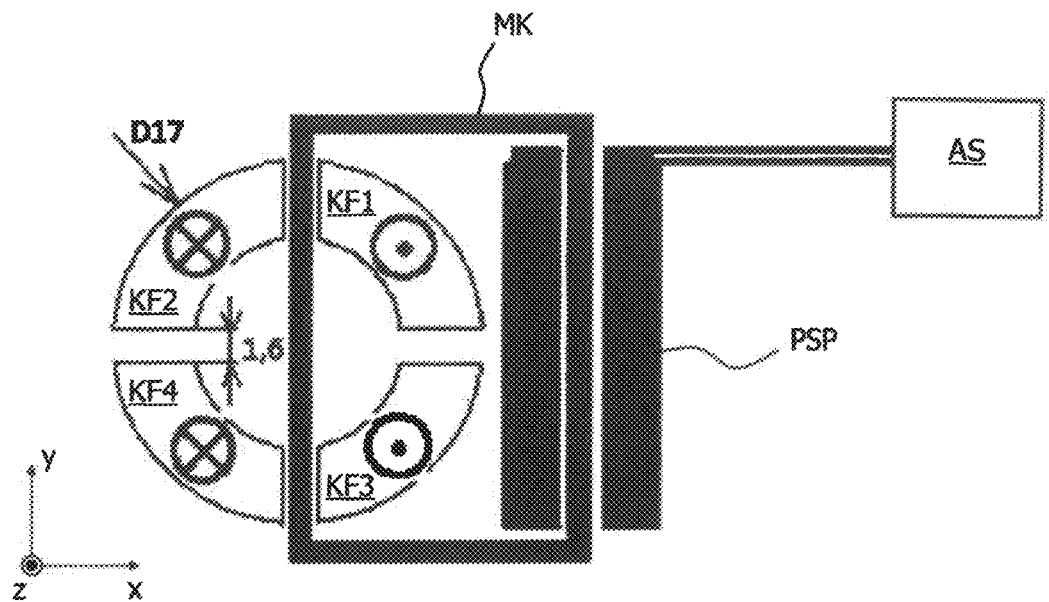
FIG. 10 a plan view upon the arrangement of two contact fingers inside and two contact fingers outside a magnetic core for generating an induction voltage.

FIG. 10 shows a schematic plan view of a socket BU with four separate contact fingers KF1, KF2, KF3, and KF4, which extend over a circular ring sector of approximately 90°, respectively. Exemplary dimensions (diameter, gap distance) are indicated in mm. Two of these contact fingers, KF1 and KF3, are surrounded by a soft magnetic core MK (e.g. made of nanocrystalline or amorphous material, a ferrite, or a similar magnetic material), with the circumferentially closed core MK in turn being wrapped around a portion of a multi-layer primary coil PSP, for example from lacquered copper wire, lying outside the socket. The primary coil PSP is connected to an evaluation circuitry AS, via which suitable current and/or voltage profiles can be impressed.

According to the principle of a transformer, current fluctuations in the primary coil PSP generate a changing magnetic field which is bundled and forwarded by the core MK. As can be seen from the side view of FIG. 11, the contact fingers KF1 and KF3, enclosed by the core MK, and the external contact fingers KF2 and KF4 by virtue of the plugged-in plug pin ST form a closed current path about the core MK, which can also be understood as a secondary coil with one turn. The changing magnetic field in the core MK therefore leads to an induction voltage $U_{ind}$ and thus to corresponding induction currents within this current path (see the arrow tips indicated in FIG. 10 in the contact fingers KF1, KF3 and arrow ends in the contact fingers KF2 and KF4). These induction currents must flow across the contact regions between the contact fingers and the plug pin ST and thus constitute the desired sensor for the contact properties or the contact resistance in the contact regions.

Figure 12:
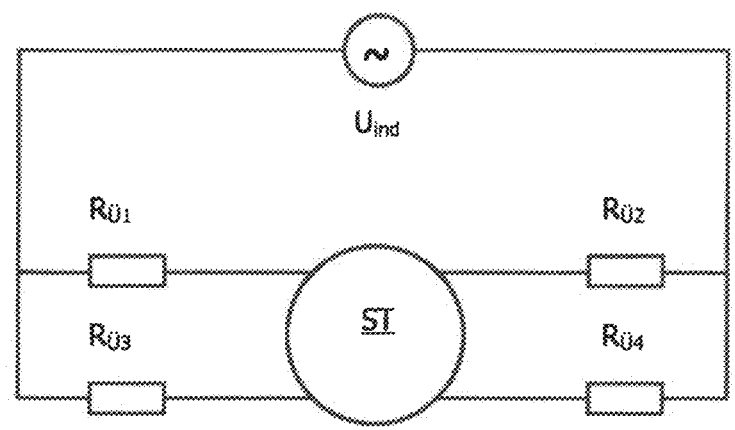
FIG. 12 the equivalent circuit diagram for the arrangement of FIGS. 10 and 11.

The described structure involves ultimately two series-connected parallel connections of two contact fingers each according to the equivalent circuit diagram of FIG. 12, with the material resistances being neglected for the sake of simplicity. The total resistance in this induction circuit of the "secondary coil" is calculated with $$R_{13}=R_{01}R_{03}/(R_{01}+R_{03})$$

$$R_{24}=R_{02}R_{04}/(R_{02}+R_{04})$$

as $$R_{tot,ind}=R_{13}+R_{24}$$

In contrast to the circuitry of FIG. 12, the contact fingers are connected in parallel in normal operation of the plug device. The total resistance is then $$R_{tot,ind}=R_{13}R_{24}/(R_{13}+R_{24})$$

If all four contact resistances are the same, i.e.

$$R_{01}=R_{02}=R_{03}=R_{04}=R_0,$$

then
$R_{tot,ind}=R_0$ and $R_{tot,B}=R_0/4$, i.e. $R_{tot,B}=R_{tot,ind}/4$ applies.

If the four contact resistances assume unequal values (in practice statistically distributed), the measured value $R_{tot,ind}$ determined with the method described here can exceed the value of $R_{tot,B}$, but is therefore "on the safe side".

In a modified approach, the evaluation circuitry AS could be configured on the primary winding PSP in such a way as to not only determine the complex input impedance Z and thus $R_{tot,ind}$, but also to measure with $I_{B13}$ the portion of the operating current flowing via the contact fingers KF1 and KF3 enclosed by the magnetic core MK in FIG. 10 (cf. transformer/current transformer principle). When the evaluation circuitry also knows the current $I_{B24}$ across the other contact fingers KF2, KF4 or the operating current $I_B$ itself (for example through measurement), the following relations can be utilized:

$$I_B=I_{B13}+I_{B24}$$

$$I_{B24}R_{24}=I_{B13}R_{13}$$

$$R_{tot,ind}=R_{13}+R_{24}$$

$$R_{tot,B}=R_{13}R_{24}/(R_{13}+R_{24})$$

The last two relations have already been used before. When this system of equations is solved for $R_{tot,B}$, this leads to $$R_{tot,B}=R_{tot,ind}I_{B13}I_{B24}/(I_{B13}+I_{B24})^2$$

Using this formula, the evaluation circuitry AS can yield not only information about $R_{tot,B}$, but $R_{tot,B}$ itself.

Figure 11:
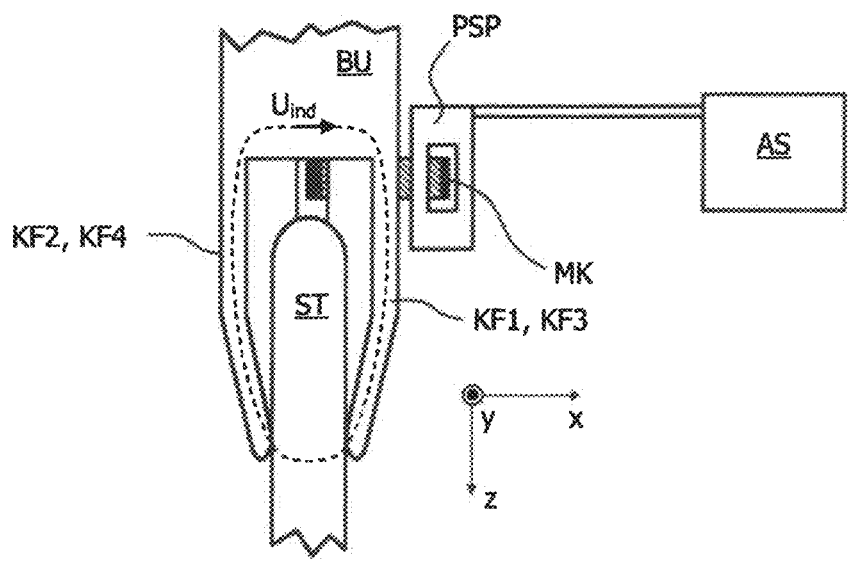
FIG. 11 a side view of the arrangement of FIG. 10.

To determine $R_{tot,ind}$, the evaluation circuitry AS of FIGS. 10, 11 measures the (complex) input impedance Z of the primary coil PSP, which input impedance depends, i.a., on $R_{tot,ind}$.

Figure 13:
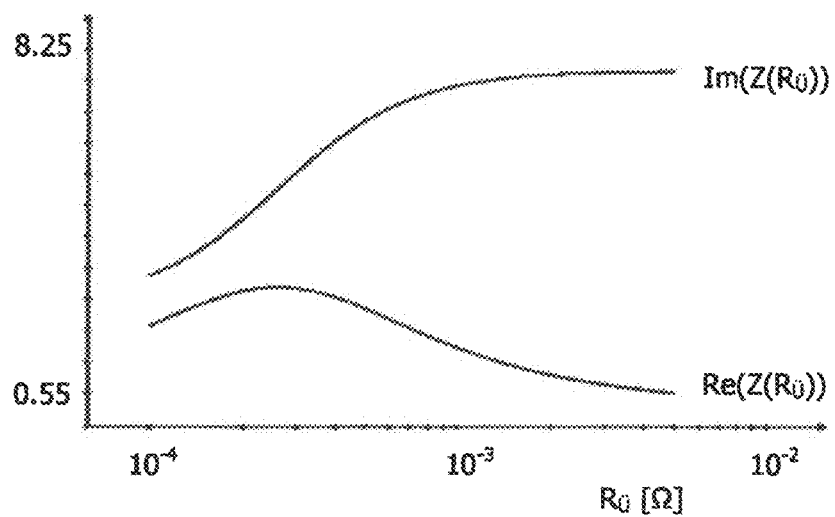
FIG. 13 exemplary curves of real part and imaginary part of the input impedance of the system of FIGS. 10 and 11 as a function of the contact resistance in the contact region.

In this regard, FIG. 13 shows the result of a simulation with typical parameters for the used components. The real part Re (Z ($R_0$)) and the imaginary part Im (Z ($R_0$)) of the complex input impedance Z are shown as a function of the contact resistance $R_0$ (with above assumption that all individual contact resistances are the same). It is readily apparent from the graphic that the input impedance Z of the measuring circuit changes significantly when the contact resistance $R_0$ changes, An evaluation circuitry AS connected to the measuring circuit is thus able to determine the sought contact resistance on the basis of the input impedance.

The simulation assumes that the magnetic core MK is designed in such a way that the magnetic flux density of 1 Tesla is attained when excited with 127 A. If the excitation is even stronger, saturation of the magnetic circuit can be expected. This saturation can occur, for example, when, during heavy start-up for several seconds, currents flow considerably above the nominal current, of which currents the two contact fingers that are enclosed by the core account for about half. The downstream electronics will therefore measure falsified Z values in the range of the operating current peak value, but will detect meaningful values in the vicinity of the operating current zero crossing. The evaluation circuitry AS can therefore optionally be designed in such a way that it carries out a measurement synchronized with the operating current (50 Hz), in particular only near the zero crossing of the operating current.

The described method with the induction of a measuring current can, optionally, also be carried out using a sensor. For example, a sensor F according to FIG. 2 could assume the role of the contact fingers lying outside (or inside) the magnetic core. Furthermore, a split plug pin could replace several contact fingers.

The principle on which the above approaches are based is that per induction the contact points between socket and plug phi can be examined with the help of a magnetic core, when being able to form a dosed path (curve, line) guided through electrically conductive material and traversing the area spanned by the magnetic core, only with simultaneous participation of contact dements of the first and second plug devices.

These conditions can also be achieved hi alternative constellations, as already illustrated (Note: For sake of clarity, the turns of a primary winding, which wrap around the magnetic core in a manner similar to that of a transformer, are not shown hi FIGS. 14 to 18).

Figure 14:
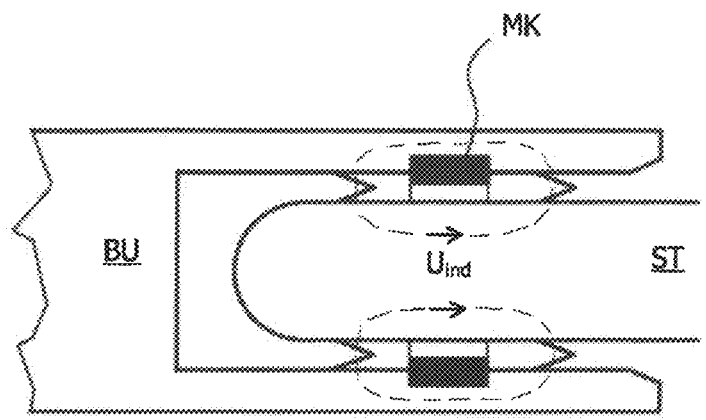
FIG. 14 an alternative arrangement of a magnetic core around a plug pin and between two contact regions.

FIG. 14 shows the arrangement of a magnetic core MK which runs around a plug phi ST within a socket BU, with contact regions being present between plug pin ST and socket BU on both sides next to the core MK in axial direction, A current path of the desired type then extends from the plug pin ST via a first of the contact regions plug pin/socket to the socket BU (or its contact finger), and from there via the second of the contact regions plug pin/socket back to plug pin ST.

Another approach is depicted in FIGS. 15 to 18. In this case, only the contact region between plug pin ST and socket BU effectively runs through the area of the magnetic core MK.

Figure 15:
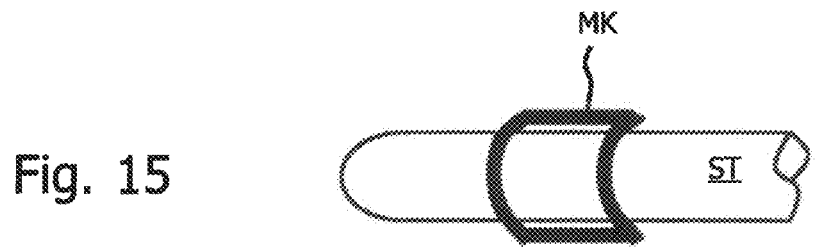
FIG. 15 a perspective view of the arrangement of a magnetic core relative to a plug pin, with the magnetic core enclosing the contact region between the plug pin and a contact finger of the socket (not shown)

As can be seen from the perspective view of FIG. 15, the shape of the magnetic core MK, which is rectangular in plan view, bears upon the plug pin ST in a semi-cylindrical manner.

Figure 16:
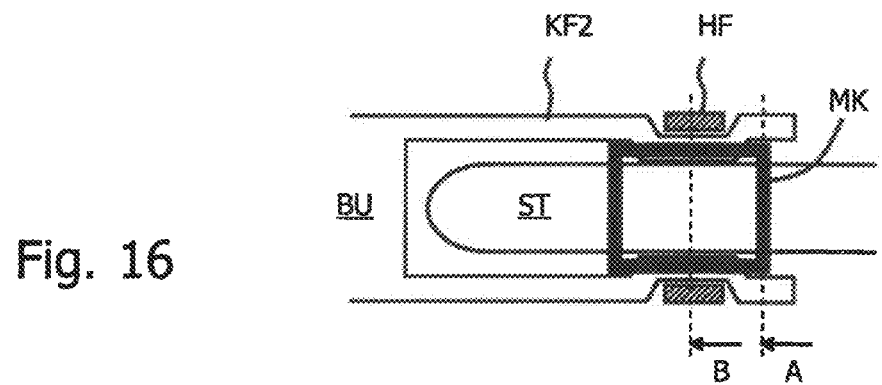
FIG. 16 a longitudinal sectional view through the arrangement of FIG. 15 with simultaneous illustration of the socket.

In the axial sectional view of FIG. 16, this three-dimensional shape of the magnetic core MK appears as a rectangle. FIG. 16 further illustrates the socket BU, which includes two parallel contact fingers KF1 and KF2. In the area of an outer sleeve spring HF wrapped around 360°, the contact fingers KF1, KF2 touch the plug pin ST in first and second contact regions, respectively. The first one of these two contact regions, between the first contact finger KF1 and the plug pin ST (on the left in FIG. 18 in cross section along the line "B"), is enclosed by the magnetic core MK.

The current path in which the desired induction voltage is generated runs from the plug pin ST via the first contact region KF1/ST, through the first contact finger KF1, via the bottom of the socket BU and/or the sleeve spring HF to the second contact finger KF2, from there via the second contact region KF2/ST back to the plug pin ST.

An advantage of this embodiment is its applicability with sockets having free-standing contact fingers as well as (as shown) with sockets having distally connected contact fingers.

In the examples presented so far, there was no further discussion as to whether the involved current paths were continuously conductive or (only) capacitively conductive. In any case, all examples work with a conductive conductivity, in which a permanent direct current can be conducted through the current path.

However, it is also possible that an involved current path is only capacitively conductive at at least one point, i.e. a capacitance in series connection. Such a current path is unable to conduct permanent direct current, only alternating current. Apart from that, the described examples work unchanged.

The use of a current path that is possibly only capacitively conductive is illustrated in FIG. 19. This shows schematically a current path which includes a plug pin ST, a socket BU, and a socket-side sensor F. In contrast to the arrangement of FIG. 2, provision is made within the socket BU for an electrically insulating pressure pad DK which presses the sensor F onto the plug pin ST. In this way, a sufficiently tight contact between sensor F and plug pin ST should be ensured. Even when oxide layers or the like should prevent conductive electrical conduction from the sensor F to the plug pin ST, a sufficiently high capacitance is formed between the sensor F and the plug pin ST to permit a usable high (alternating) current flow in the current path. Measures like, for example, the described fritting of the contact would therefore not be necessary.

The electrical equivalent circuit diagram of such an arrangement is shown superimposed in FIG. 19, with $C_F$ being the capacitance and $R_F$ being the ohmic resistance between sensor F and plug pin ST. $R_{iso}$ designates the insulation resistance between the sensor F and the socket BU and is typically in the order of at least 5 MΩ.

Optionally, in such an embodiment, only the conditions at the transition between sensor F and plug pin ST may initially be determined in a separate measurement, i.e. $C_F$ and $R_F$, for example by a measurement without operating current and/or a measurement without inserted plug pin ST. The result of this determination can then enter into the implementation and/or evaluation of the subsequent actual measurement in order to improve its reliability.

Another expansion of the invention is illustrated in FIG. 20. This approach involves an independent detection of the condition whether a plug pin ST is plugged into the socket BU at all. This makes it possible to differentiate between the cases "no plug pin inserted" and "infinitely high contact resistance".

The plugging state is preferably detected mechanically in order to be independent on the current feed. As indicated in FIG. 20, the sensor F can, for example, be mechanically coupled to the switch of a detection circuitry DS. The sensor F is moved as an inserted plug pin ST touches, and this movement is converted mechanically into an opening (or closing) of the switch of the detection circuitry DS. The switch status can then be externally queried again.

Figure 21:
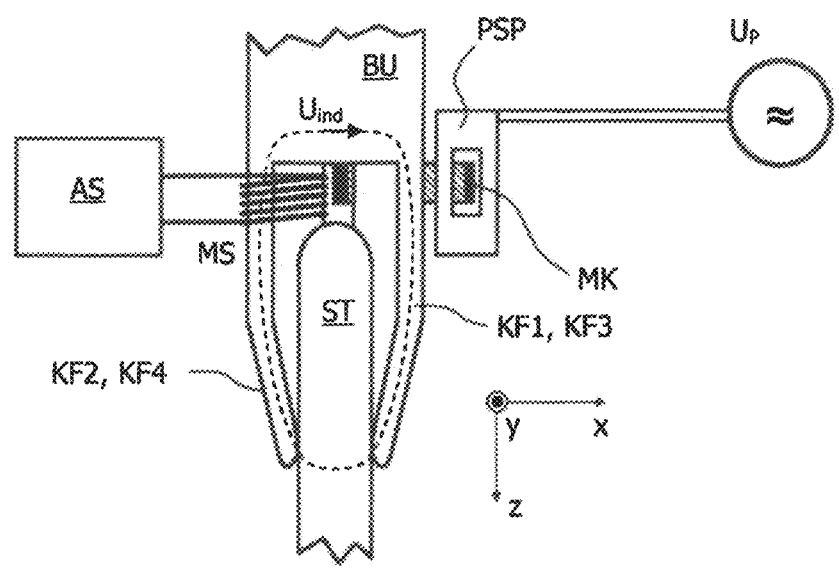
FIG. 21 a modification of the arrangement of FIG. 11 with a measuring coil around the current path.

FIG. 21 shows a modification of the arrangement of FIG. 11, with only the differences being described hereinafter and otherwise reference is made to the above description.

In the modified arrangement, an alternating magnetic field is again induced in the magnetic core MK via the primary coil PSP by connecting an alternating voltage source $U_p$ to the primary coil PSP (this alternating voltage source is a part of the evaluation circuitry AS, not shown in detail in FIG. 11).

The (reactive) effects of a current flow induced by the magnetic alternating field of the core in the current path of interest are, however, no longer ascertained via the primary coil PSP in this arrangement. Instead, a further coil is arranged around the current path and is connected to the evaluation circuitry AS as measuring coil MS. A measurable electrical quantity (e.g. voltage) is induced in the measuring coil MS directly by the current flow in the current path that the measuring coil surrounds.

As indicated in the Figure, the entire current path can run through the measuring coil MS, when the measuring coil MS encloses all of the contact fingers of a current direction (here KF2 and KF4 or KF1 and KF3) encloses. As an alternative, only part of the current path could be detected, for example when the measuring coil MS were to run only around a single contact finger.

Finally, the most important aspects of the invention, which can be implemented individually or in combination, are listed again, with bracketed reference symbols referring to exemplary embodiments of the Figures:

A) Method for the determination of the electrical contact properties (RÜ) in the contact region between a first contact element (BU) of a first plug device (SV1) and a second complementary contact element (ST) of a second plug device (SV2), with the properties of a current path being evaluated, which current path includes the first contact element (BU), the contact region, and from the second plug device (SV2) only the following: the second contact element (ST) and, optionally, further contact elements of the second plug device (SV2),
wherein
a) an induction voltage (Uind) is generated in the current path so that measurements can be made in the current path to allow conclusions about the contact properties of interest; and/or
b) the current path includes at least one sensor (F, F1, F2) which is arranged in the first plug device (SV1) and contacts the second contact element (ST) when plugged together; and/or
c) the current path includes at least two sensors (F, F1, F2) which are arranged in the first plug device (SV1) and contact the second contact element (ST) when plugged together; and/or
d) the current path includes at least one sensor (F, F1, F2) which is arranged in the first plug device (SV1) and contacts the second contact element (ST) when plugged together, and wherein a breakdown voltage (UD) is applied between the sensor (F, F1, F2) and the second contact element (ST); and/or
e) the evaluation is synchronized with the course of an operating current (IB) across the contact region; and/or
f) the current path includes at least one sensor (F, F1, F2) which is arranged in the first plug device (SV1) and contacts the second contact element (ST) when plugged together, and wherein a capacitance of more than approximately 10 pF is provided in the current path to allow an alternating current flow in the current path; and/or
g) the voltage drop (UB) is measured across the current path and occurs when an operating current (IB) flows across the contact region; and/or
h) the current path forms the secondary coil on a magnetic core (MK) on which a primary coil (PSP) is also arranged.

B) Plug device (SV1) with at least one first contact element (BU), which contacts in a contact region a complementary second contact element (ST) of a second plug device (SV2) when plugged together, with the plug device having a current path, which includes the first contact element (BU), the contact region, and from the second plug device (SV2) only the following: the complementary second contact element (ST) and, optionally, further contact elements of the second plug device (SV2),
wherein
a) the plug device includes means for generating an induction voltage ($U_{ind}$) for a method according to point A); and/or
b) the plug device includes at least one sensor (F, F1, F2), which contacts a complementary second contact element (ST) of the second plug device (SV2) when plugged together; and/or
c) the plug device includes at least two sensors (F, F1, F2) which contact a complementary second contact element (ST) of the second plug device (SV2) when plugged together; and/or
d) the plug device includes at least one sensor (F, F1, F2), which contacts a complementary second contact element (ST) of the second plug device (SV2) when plugged together, and includes means for generating a breakdown voltage (UD); and/or
e) the plug device includes a magnetic core (MK), which surrounds the first contact element (BU) and/or a sensor (F) and/or the contact region; and/or
f) the plug device includes an evaluation circuitry (AS) for evaluating the properties of a current path according to a method according to point A).

What is claimed is:

1. A method for the determination of an electrical contact property in a contact region between a first contact element of a first plug device and a second complementary contact element of a second plug device, said method comprising:
evaluating a property of a current path which includes the first contact element, the contact region, and from the second plug device only the second contact element; and
generating an induction voltage in the current path for a measurement in the current path to thereby enable to draw a conclusion about the electrical contact property.

2. The method of claim 1, further comprising adding in the current path at least two sensors which are arranged in the first plug device and contact the second contact element when the first and second contact elements are plugged together.

3. The method of claim 1, further comprising synchronizing the evaluation of the property of the current path with a course of an operating current across the contact region.

4. The method of claim 1, further comprising:
disposing in the current path a sensor which is arranged in the first plug device and contacts the second contact element when the first and second contact elements are plugged together, and
forming in the current path a capacitance of more than about 10 pF to allow an alternating current flow in the current path.

5. The method of claim 1, further comprising measuring a voltage drop across the current path that occurs when an operating current flows across the contact region.

6. The method of claim 4, further comprising establishing a defined contact property between the sensor and the second contact element.

7. The method of claim 6, wherein the defined contact property between the sensor and the second contact element is established by applying a breakdown voltage.

8. The method of claim 1, wherein the current path forms a secondary coil on a magnetic core, and further comprising arranging a primary coil on the magnetic core.

9. The method of claim 1, wherein the second contact element is a plug pin and wherein the current path includes at least two contact fingers which both contact the plug pin.

10. A method for the determination of an electrical contact property in a contact region between a first contact element of a first plug device and a second complementary contact element of a second plug device, said method comprising:
evaluating a property of a current path which includes the first contact element, the contact region, and from the second plug device only the second contact element; and
adding in the current path at least two sensors which are arranged in the first plug device and contact the second contact element when the first and second contact elements are plugged together.

11. A method for the determination of an electrical contact property in a contact region between a first contact element of a first plug device and a second complementary contact element of a second plug device, said method comprising:
evaluating a property of a current path which includes the first contact element, the contact region, and from the second plug device only the second contact element; and
synchronizing the evaluation of the property of the current path with a course of an alternating operating current across the contact region by carrying out measurements in a range of zero crossings of the alternating operating current.

12. A method for the determination of an electrical contact property in a contact region between a first contact element of a first plug device and a second complementary contact element of a second plug device, said method comprising:
evaluating a property of a current path which includes the first contact element, the contact region, and from the second plug device only the second contact element;
disposing in the current path a sensor which is arranged in the first plug device and contacts the second contact element when the first and second contact elements are plugged together; and
forming in the current path a capacitance of more than about 10 pF to allow an alternating current flow in the current path.

13. A plug device, comprising:
a first plug device including a first contact element;
a second plug device including a second contact element which complements the first contact element and contacts the first contact element, when the first and second contact elements are plugged together in a contact region;
a current path including the first contact element, the contact region, and from the second plug device only the second contact element; and
means for generating an induction voltage in the current path for a measurement in the current path to thereby enable to draw a conclusion about an electrical contact property in a contact region between the first contact element and the second contact element.

14. The plug device of claim 13, further comprising at least two sensors configured to contact the second contact element when the first and second contact elements are plugged together.

15. The plug device of claim 13, further comprising a sensor disposed in the current path and arranged in the first plug device, said sensor contacting the second contact element when the first and second contact elements are plugged together, wherein the means includes a magnetic core configured to surround the first contact element and/or the sensor and/or the contact region.

16. The plug device of claim 13, further comprising an evaluation circuitry configured to evaluate the electrical contact properties of the current path.

17. A plug device, comprising:
a first plug device including a first contact element;
a second plug device including a second contact element which complements the first contact element and contacts the first contact element, when the first and second contact elements are plugged together in a contact region;
a current path including the first contact element, the contact region, and from the second plug device only the second contact element; and
at least two sensors configured to contact the second contact element when the first and second contact elements are plugged together.

* * * * *